United States Patent [19]

Anami

[11] Patent Number: 4,891,793

[45] Date of Patent: Jan. 2, 1990

[54] DISCHARGE CIRCUIT FOR A SEMICONDUCTOR MEMORY INCLUDING ADDRESS TRANSITION DETECTORS

[75] Inventor: Kenji Anami, Hyogo, Japan

[73] Assignee: Mitsubishi Denki Kabushiki Kaisha, Tokyo, Japan

[21] Appl. No.: 183,713

[22] Filed: Apr. 19, 1988

[30] Foreign Application Priority Data

Apr. 20, 1987 [JP] Japan .................................. 62-98412

[51] Int. Cl.⁴ .............................................. G11C 7/00
[52] U.S. Cl. ................................ 365/204; 365/225.6; 365/230.06; 365/233.5
[58] Field of Search ............... 365/230, 203, 204, 233, 365/155, 179, 230.06, 225.6, 233.5

[56] References Cited

U.S. PATENT DOCUMENTS

| | | | |
|---|---|---|---|
| 3,942,162 | 3/1976 | Buchanan | 365/203 |
| 4,168,490 | 9/1979 | Stinehelfer | 365/204 |
| 4,366,558 | 12/1982 | Homma et al. | 365/203 |
| 4,393,473 | 7/1983 | Rufford | 365/155 |
| 4,520,462 | 5/1985 | Yamada et al. | 365/203 |
| 4,730,278 | 3/1988 | Koury, Jr. et al. | 365/203 |

FOREIGN PATENT DOCUMENTS

| | | | |
|---|---|---|---|
| 0024853 | 3/1981 | European Pat. Off. | 365/203 |
| 0170990 | 8/1986 | Japan | 365/204 |

Primary Examiner—Glenn A. Gossage
Attorney, Agent, or Firm—Lowe, Price, LeBlanc, Becker & Shur

[57] ABSTRACT

A semiconductor memory device in which the transition of the address signal is detected and the discharge of the lower word line is carried out in response to the detection signal. High speed and reliable discharge of the word line can be carried out, thereby implementing high speed and reliable reading and writing operation.

9 Claims, 5 Drawing Sheets

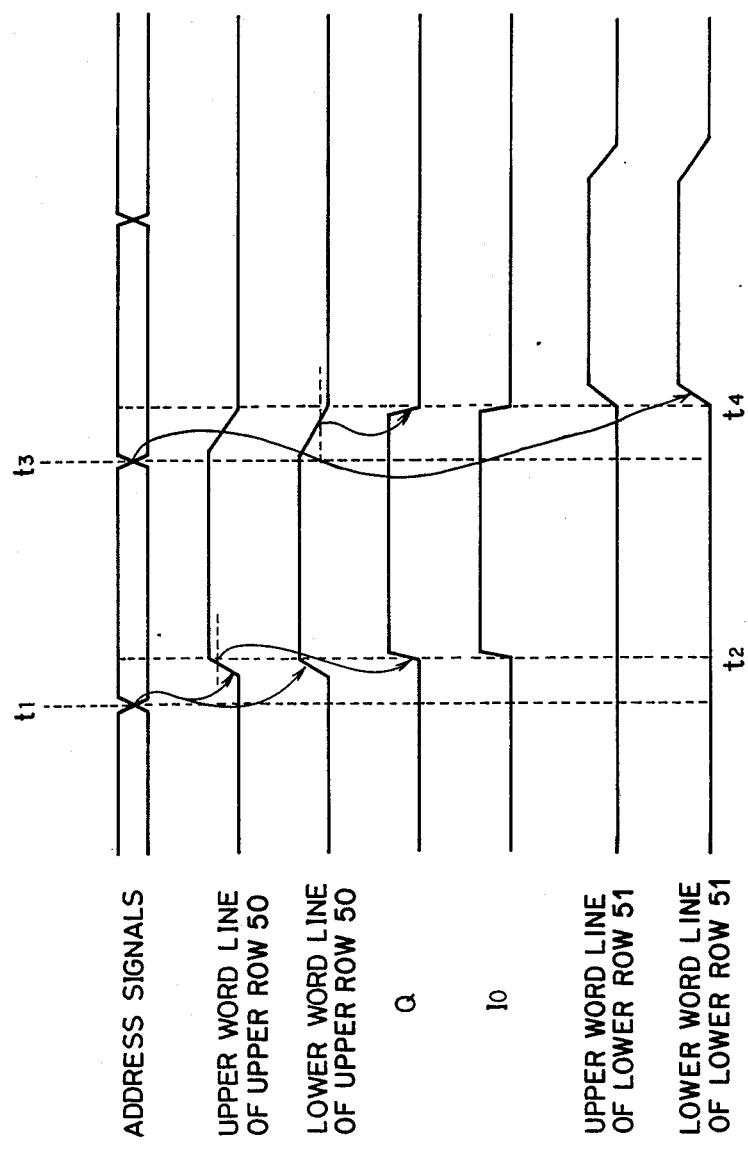

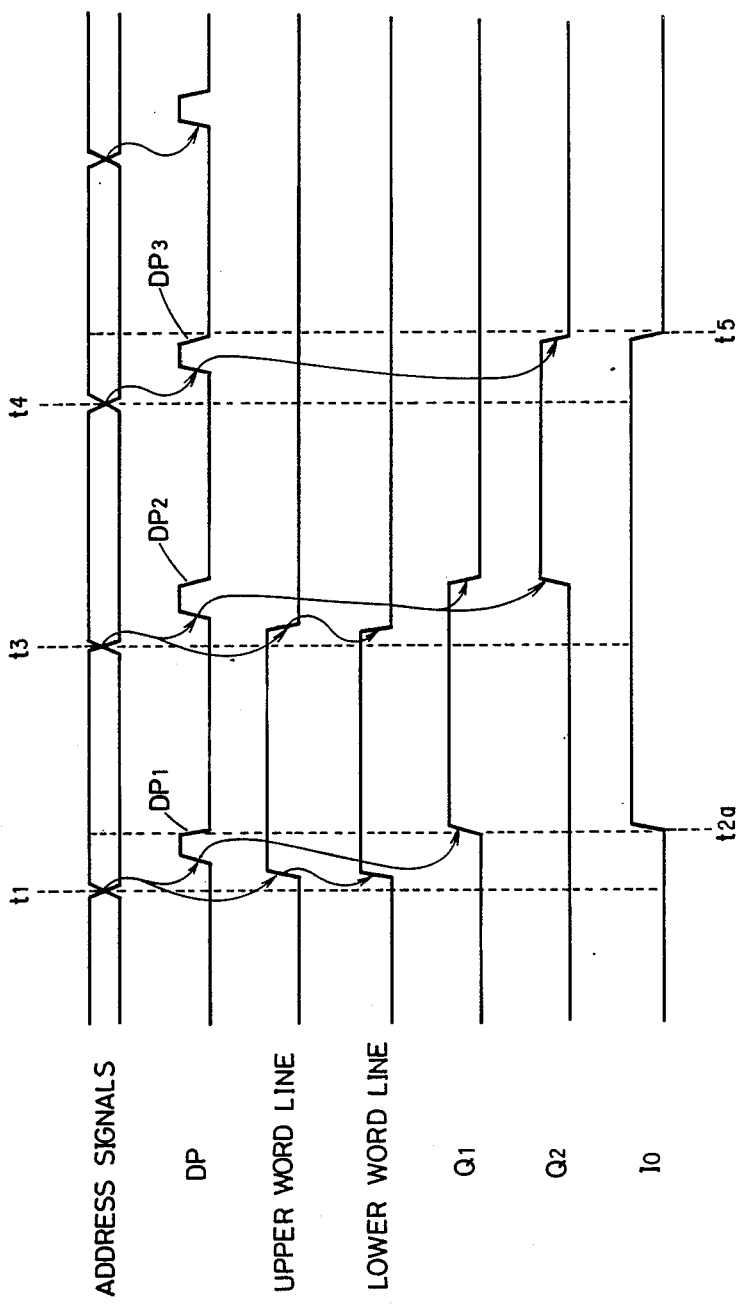

DISCHARGE CIRCUIT FOR A SEMICONDUCTOR MEMORY INCLUDING ADDRESS TRANSITION DETECTORS

CROSS REFERENCE TO A RELATED COPENDING APPLICATION

A related patent of particular interest to this application is U.S. Pat. No. 4,821,234 entitled "Semiconductor Memory Device" issued on Apr. 11, 1989 and assigned to the same assignee of the present application.

BACKGROUND OF THE INVENTION

1. Field of the Invention

The present invention relates to a semiconductor memory device and, more specifically, it relates to a semiconductor memory device with an improved word line discharging circuit.

2. Description of the Prior Art

FIG. 1 is a schematic diagram showing a conventional word line discharging circuit of a semiconductor memory device having upper and lower word lines. The circuit shown is the word line discharging circuit disclosed in U.S. Pat. No. 4,168,490, with some supplement. The word line driving circuit of FIG. 1 illustrates two row-address lines connected to a row decoder 10 for the purpose of simplification.

Referring to FIG. 1, the output of the row decoder 10 is connected to the upper word line 2 through a word line driving transistor 9 which is connected to the first power supply $V_{cc}$. A number of memory cells are connected between the upper word line 2 and the lower word line 3. The power supply $V_{cc}$ is to provide a prescribed high voltage to the upper and lower word lines 2 and 3 when the row address line thereof is selected. The upper word line 2 and the lower word line 3 are respectively connected to the set input "S" and the reset input "R" of the SR flip flop 4. A series connection of a transistor 5 and a resistor 6 is connected between the lower word line 3 and the second power supply $V_{EE}$. The series connection is to discharge the voltage of the lower word line 3 to the power supply $V_{EE}$ when the row address line is switched from the selected state to the non-selected state. The base of the transistor 5 is connected to the output "Q" of the SR flip flop 4. Another series connection including a transistor 21 and the resistor 22 connected between the lower word line 3 and the power supply $V_{EE}$ is to allow a constant current flow constantly from the lower word line 3 to the power supply $V_{EE}$. Although the description is made for the upper side row address line 50 of FIG. 1, the structure of the lower side row address line 51 is similar to that described in the foregoing, so that the description thereof will be omitted.

FIG. 2 is a schematic diagram of an emitter-coupled bipolar RAM (Random Access Memory) cell, which is one example of the memory cell 1 of the semiconductor memory device shown in FIG. 1. The memory cell comprises two transistors Q1 and Q2 each of which has two emitters, and resistors R1 and R2 respectively connected in series to the transistors Q1 and Q2. The memory cell is connected to the upper word line 2, lower word line 3, complementary bit line 31 and true 1-bit line 32.

In operation, the upper word line 2 and the lower word line 3 are respectively brought to a prescribed high level voltage to carry out the reading or writing operation of the memory cell.

Returning to FIG. 1, the operation of the word line discharging circuit will be described below.

When the row address line thereof is selected, the row decoder 10 applies a high level voltage to the base of the transistor 9, so that the transistor 9 turns on. The upper word line 2 is brought to a prescribed high level voltage by the transistor 9. The lower word line 3 is also brought to a prescribed high level voltage by the voltage applied from the upper word line 2 through the memory cells 1. After reading or writing operation is carried out for a specified memory cell, another row-address line, for example, the lower row-address line of FIG. 1 is selected and the reading or writing operation is carried out in the similar manner. When the reading or writing operation of another row-address line starts, the upper word line 2 and the lower word line 3 of that row-address line which was subjected to the previous reading or writing operation should be brought to their respective standby voltages. Otherwise, the reading or writing operation may possibly be carried out again.

When the upper word line 2 is brought to the high level voltage, the RS flip flop 4 is set and a high level voltage is outputted from the output "Q". The transistor 5 turns on and the lower word line 3 is connected to the power supply $V_{EE}$ through the transistor 5 and the resistor 6. Thereafter, when another row-address line is selected, the voltages of both word lines 2 and 3 rapidly fall since the transistor 5 has already been conductive. When the voltage of the lower word line 3 is entirely lowered, the RS flip flop is reset and it outputs a low level voltage from the output "Q". The transistor 5 turns off and discharge from the lower word line stops. Therefore, due to the series connection of the transistor 5 and the resistor 6, upper and lower word lines 2 and 3 can be rapidly brought back to the standby voltage after the end of the period in which the row-address line thereof is selected. However, the voltage signal of the lower word line 3 is used for resetting the RS flip flop 4, so that the reset timing changes dependent on the manufacturing diversification of the memory device, the change in the circumferential temperature and the fluctuation in the supply voltage. Consequently, the word lines are not fully discharged or the discharge continues beyond an optimum value. If the discharge time is not sufficient, two or more row address lines are selected causing malfunctions. If the discharge continues, the power consumption increases and the memory device is destroyed due to the high temperature.

FIG. 3 is a timing chart of the word line discharging circuit of FIG. 1, provided for the supplement of the above description.

Referring to FIG. 3, let us assume that the upper row-address line 50 is selected at the time t1 and the lower row-address line 51 is selected at the time t3. In the period between the time t1 and t3, the upper and lower word lines 2 and 3 are respectively brought to the high level voltage. When the upper word line 2 rises to the voltage of a certain value, the RS flip flop 4 is set and the output "Q" is brought to the high level, while it is reset when the lower word line 3 falls to the voltage of a certain value and the output "Q" is brought to the low level. Therefore, the discharge current Io of the lower word line 3 flowing through the transistor 5 and the resistance 6 flows during the period between the time t6 to t4 due to the conduction of the transistor 5. As described above, the RS flip flop 4 turns the transistor 5 on in response to the voltage of the lower word line 3, so that the time t4 is not stable, causing the above described disadvantages. A reference of the prior art of a particular interest to the semiconductor memory device of the present invention is shown in the U.S. Pat. No. 4,366,558 entitled "MEMORY DEVICE WITH FAST WORD-LINE DISCHARGING CIRCUITS" issued to Homma et al. on Dec. 28, 1982. Another reference of the prior art is the U.S. Pat. No. 4,520,462 entitled "SEMICONDUCTOR MEMORY DEVICE" issued to Yamada et al. on May 28, 1985. Both of the above described references disclose a circuit in which the lower word line is rapidly discharged by applying a signal which is delayed from the voltage change of the upper word line.

SUMMARY OF THE INVENTION

Therefore, a main object of the present invention is to provide a semiconductor memory device which is capable of reliable and high speed reading and writing operation by effecting stable discharging operation of the word line.

Briefly stated, the present invention comprises transition detection means which detects the transition in the signals required for designating the memory cell and outputs a transition detection signal, discharge control means which receives the voltage of a first word line for outputting a discharge control signal in response to the transition detection signal, and switching means which continues to discharge a second word line in response to the discharge control signal.

According to the present invention, the transition detection means detects the transition in the signal required for designating the memory cell and applies the transition detection signal to the discharge control means. The discharge control means applies a discharge control signal to the switching means in response to the transition detection signal. The switching means discharges a second word line in response to the discharge control signal. Namely, the discharge of the second word line is carried out in response to the transition in the signal required for designating the memory cell, so that the stable discharge of the word line can be effected.

According to the present invention, a semiconductor memory device can be provided which is capable of reliable and high speed reading and writing operation.

In a preferred embodiment, the discharge control means comprises counter means for counting the transition detection signal. The counter means determines the period for outputting the discharge control signal by counting the transition detection signal, so that reliable and stable discharge of the switching means is provided.

These objects and other objects, features, aspects and advantages of the present invention will become more apparent from the following detailed description of the present invention when taken in conjunction with the accompanying drawings.

BRIEF DESCRIPTION OF THE DRAWINGS

FIG. 3 is a timing chart for describing the operation of the word line discharging circuit shown in FIG. 1;

FIG. 5 is a timing chart for describing the operation of the word line discharging circuit shown in FIG. 4.

DESCRIPTION OF THE PREFERRED EMBODIMENTS

Figure 4:
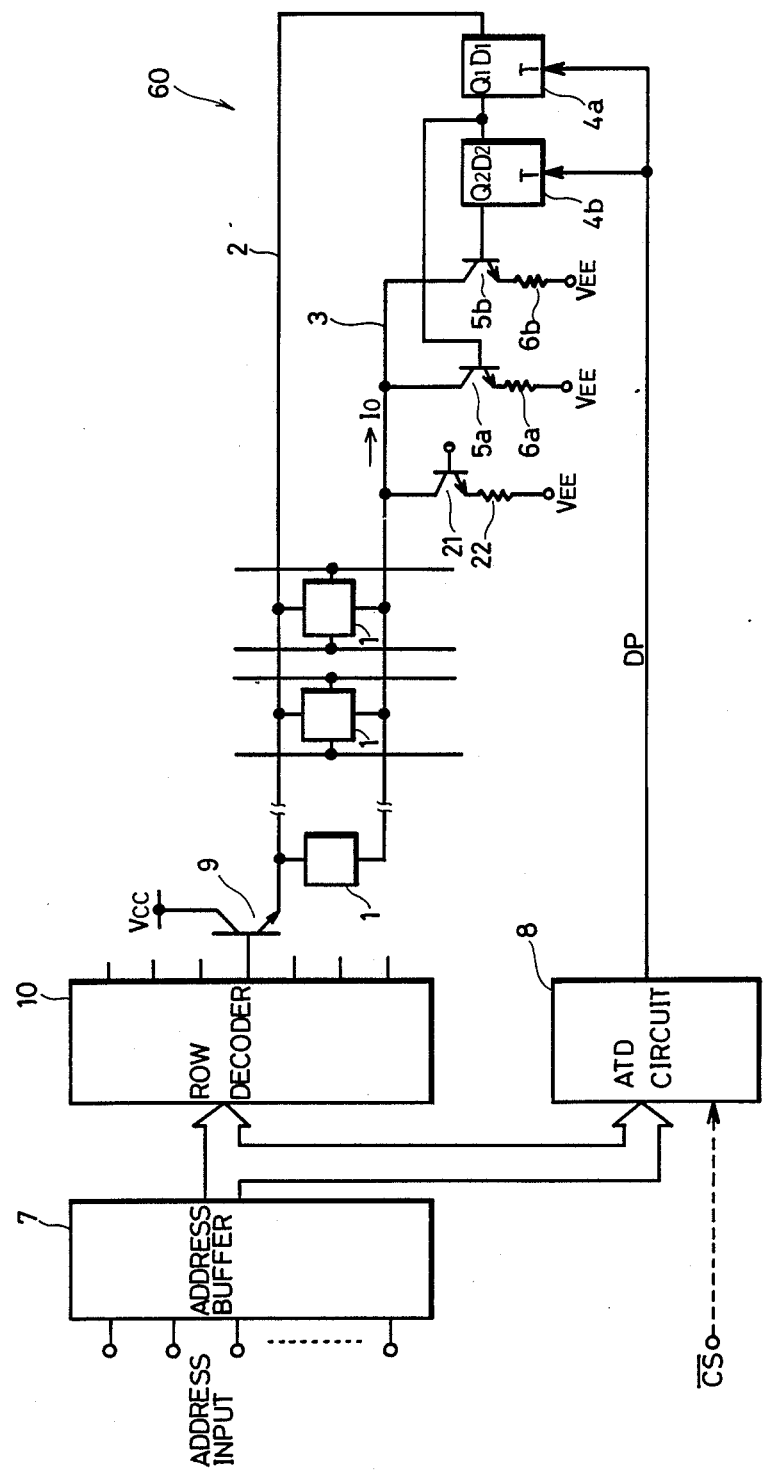
FIG. 4 is a schematic diagram showing one embodiment of the word line discharging circuit of the semiconductor memory device in accordance with the present invention.

FIG. 4 is a schematic diagram showing the word line discharging circuit of the semiconductor memory device in accordance with the present invention.

Referring to FIG. 4, an address buffer 7 receives an externally applied address signal through address input terminals. An output of the address buffer 7 is connected to a row decoder 10 and an address transition detector (hereinafter referred to as ATD). The ATD circuit 8 outputs an address transition detection pulse DP every time the address signal changes. Although a number of row-address lines are connected to the output of the row decoder 10, only row-address lines 60 and 61 shown in FIG. 4 for the purpose of simplification. The output of the row decoder 10 is connected to the upper word line 2 through a word line driving transistor 9. A number of memory cells are connected between the upper word line 2 and the lower word line 3. The first power supply $V_{cc}$ is to apply the prescribed voltage respectively to the upper word line 2 and the lower word line 3 through the transistor 9 when that row-address line 60 thereof is selected. A first series connection including a transistor 5a and a resistor 6a and a second series connection including a transistor 5b and a resistor 6b connected between the lower word line 3 and the second power supply $V_{EE}$ are the switching means for discharging the voltage of the lower word line 3 to the power supply $V_{EE}$ when the row address line 60 is switched from the selected to the non-selected condition. D type flip flops 4a and 4b are connected between the upper word line 2 and the output of the ATD circuit 8 and serve as counter means for counting the detection pulse DP from the ATD circuit 8, with the outputs thereof respectively connected to the bases of the transistors 5a and 5b. A series connection of a transistor 21 and a resistor 22 allows a constant current to flow constantly from the lower word line 3 to the power supply $V_{EE}$.

FIG. 5 is a timing chart for describing the operation of the word line discharging circuit of FIG. 4. The operation will be hereinafter described with reference to FIGS. 4 and 5.

At the time t1, an address signal is applied to the row decoder 10 through the address buffer 7. The row decoder 10 decodes the address signal, and thereafter selects the row-address line 60. When the row-address line 60 is selected, the upper word line 2 and the lower word line 3 are respectively brought to the prescribed high level voltage by the transistor 9. Meanwhile, the ATD circuit 8 detects the transition in the address signal at the time t1 and outputs an address transition detection pulse $DP_1$. In this example, the address signal also changes at time t3 and t4, so that the ATD circuit 8 also outputs the detection pulses $DP_2$ and $DP_3$ at respective time. After the time t1, the D type flip flop 4a receives the high level voltage from the upper word line 2 and applies a high level voltage to the transistor 5a in response to the detection pulse DP₁ from the ATD circuit 8. The transistor 5a turns on in response to the voltage from the flip flop 4a and a discharge current I_o flows from the lower word line 3 through the transistor 5a and the resistance 6a. At time t3, the address signal changes and another row-address line is selected. The voltage on the upper word line decreases and a low level voltage is applied to the flip flop 4a. The flip flop 4a continues to output a high level voltage from the output "Q1" until it receives the next detection pulse DP₂. The flip flop 4b receives the high level voltage from the flip flop 4a in response to the next detection pulse DP₂ and applies a high level voltage to the base of the transistor 5b. The transistor 5b turns on in response to the voltage from the flip flop 4b. The flip flop 4a outputs a low level voltage in response to the detection pulse DP₂ and the transistor 5b turns on before the transistor 5a turns off, so that the discharge current I_o continues to flow from the lower word line 3 even during the period from the time t3 to t4. At time t4, when the address signal changes, the flip flop 4b receives the low level voltage from the flip flop 4a in response to the detection pulse DP₃ and outputs a low level voltage. Therefore, the low level voltage is applied to the base of the transistor 5b from the output "Q2" of the flip flop 4b, and at time t5, the transistor 5b turns off and discharge is completed.

As described above, in the embodiment of FIG. 4, the flip flops 4a and 4b count the detection pulses DP in response to the voltage of the upper word line 2 and operate the transistors 5a and 5b. Therefore, the lower word line 3 can be surely connected to the power supply $V_{EE}$ for the prescribed period during which the address signal changes, enabling high speed and reliable discharge of the word line.

Figure 1:
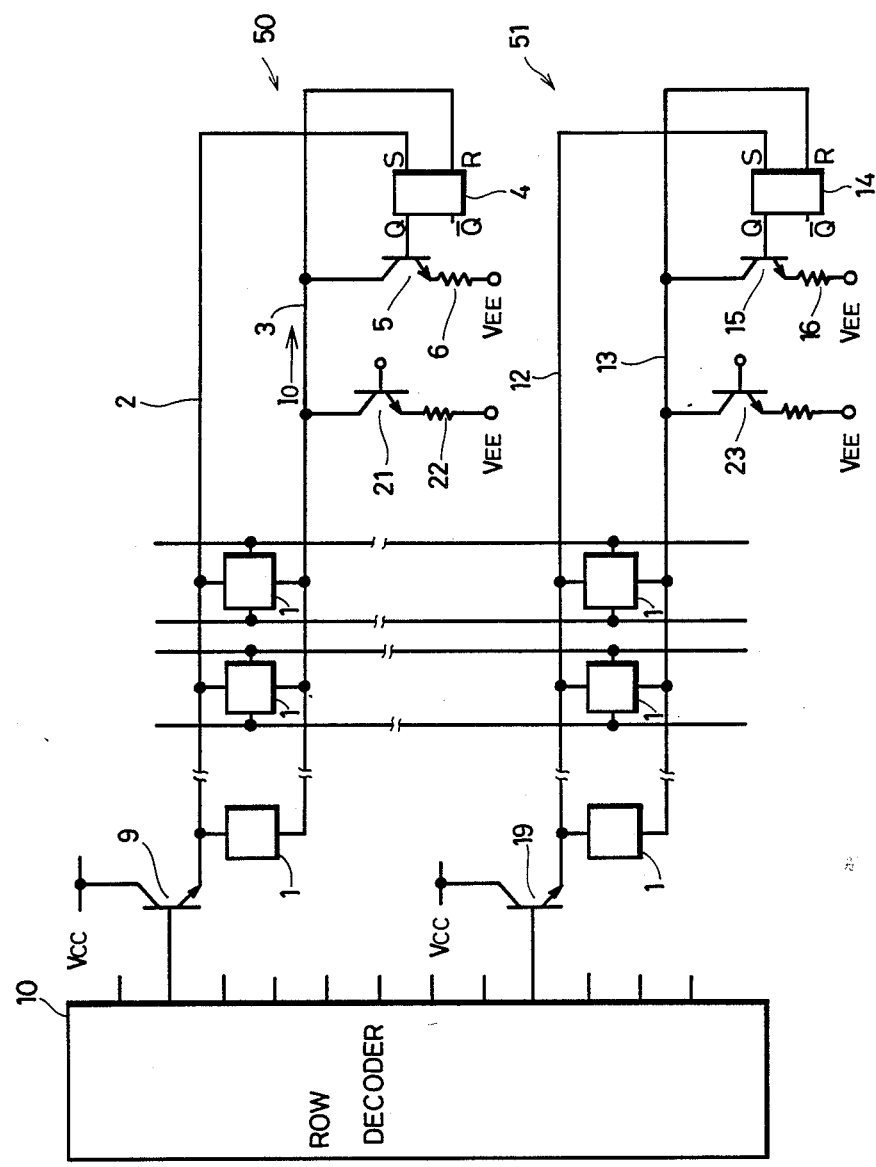
FIG. 1 is a schematic diagram showing a word line discharging circuit of a conventional semiconductor memory device.
Figure 2:
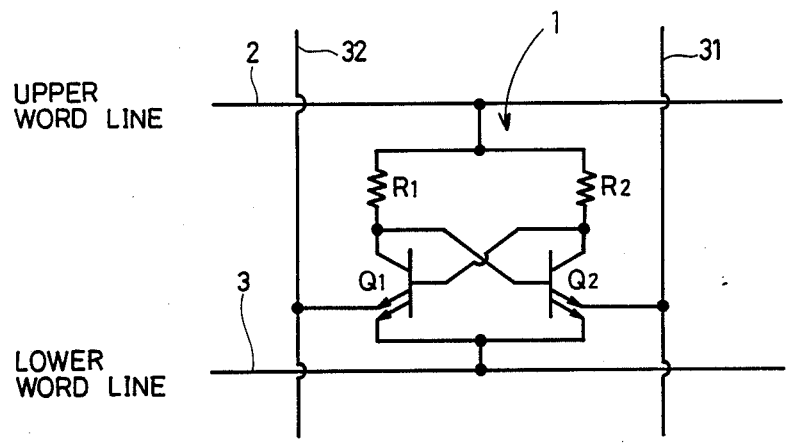
FIG. 2 is a schematic diagram showing one example of the memory cell of the semiconductor memory device shown in FIG. 1.
Figure 6:
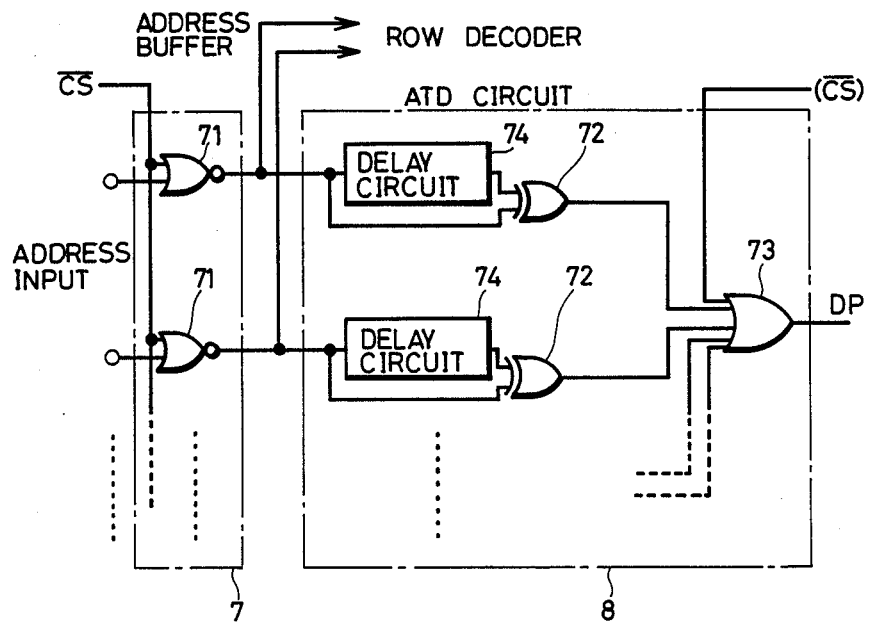
FIG. 6 is a schematic diagram showing one example of an address transition detector circuit shown in FIG. 4.

FIG. 6 is a block diagram showing the ATD circuit.

Referring to FIG. 6, the address buffer 7 comprises NOR gates 71 which receive an address signal and a chip select signal CS. The ATD circuit 8 comprises exclusive OR gates 72 which receive an output signal from the NOR gates 71 and a delayed output signal delayed by the delay circuit 74, and an OR gate 73 which receives the output signals from the exclusive OR gates 72 and the chip select signal $\overline{CS}$. The address transition detection pulse DP is outputted from the OR gate 73 and it can be seen in the timing chart of FIG. 5.

Although flip flops 4a and 4b which count the detection pulse DP in response to the voltage of the upper word line 2 are shown in the above described embodiment, other discharge control means may be applied which receives the voltage of the upper word line 2 and outputs a signal in a prescribed period in response to the transition of the address signal. Such discharge control means operates in response to the transition of the address signal and is independent of the manufacture diversification of the memory device, changes in the circumferential temperature, the voltage fluctuation of the power supply and so on, so that a semiconductor memory device having high speed and reliable read/write operation can be obtained.

Although the change of the address is detected by the transition in the address signal in the embodiment of FIG. 4, the detection of the transition in the chip select signal $\overline{CS}$ can be also applied.

As described above, the present invention comprises transition detection means for detecting the transition in a signal required for designating the memory cell and for outputting a transition detection signal, discharge control means which receives the voltage of a first word line and for outputting a discharge control signal in response to the transition detection signal, and switching means which continues to discharge a second word line in response to the discharge control signal. The transition in the signal for designating the memory cell is detected and the word line is discharged in response to the detection signal, whereby high speed and reliable read/write operation can be carried out.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor memory device comprising memory cells respectively connected to a plurality of first and second word lines, the device further comprising:

address input means for receiving a row address signal required for designating selected ones of said memory cells;

decoder means for decoding the row address signal from said address input means and, in response thereto, selecting one of said plurality of first word lines;

transition detection means for detecting a transition of a level of the row address signal applied to said address input means and outputting a transition detection signal; and a plurality of discharge control means connected to respective ones of said plurality of first word lines and to said transition detection means, each of said discharge control means receiving the voltage of an associated first word line in response to the transition detection signal from said transition detection means;

a corresponding one of said discharge control means continuing to output a discharge control signal in response to the next transition detection signal when a voltage level of a previously selected first word line of said plurality of first word lines is equal to a voltage level of said selected first word line; and switching means which continues to discharge a selected one of said second word lines in response to the discharge control signal.

2. A semiconductor memory device according to claim 1, wherein said address input means comprises address buffer means.

3. A semiconductor memory device according to claim 1, wherein said semiconductor memory device comprises a static random access memory device.

4. A semiconductor memory device according to claim 1, wherein each of said discharge control means comprises counter means responsive to the transition detection signal for counting a number of level transitions of said row address signal from said address input means.

5. A semiconductor memory device according to claim 4, wherein said counter means comprises a plurality of flip flops configured as a counter circuit.

6. A semiconductor memory device according to claim 1, wherein said switching means comprises at least one series circuit of a switching device and resistance means connected between at least one of said second word lines and a reference potential.

7. A semiconductor memory device according to claim 6, wherein said at least one series circuit comprises
   a first series connection of a first transistor and a first resistor, and
   a second series connection of a second transistor and a second resistor.

8. A semiconductor memory device comprising memory cells connected to a plurality of first and second word lines, comprising:
   address input means for receiving a row address signal for designating one of said memory cells;
   decoder means for decoding said row address signal from said address input means and selecting one of said plurality of first word lines;
   transition detection means for detecting a transition of a level of the row address signal applied to said address input means and outputting a transition detection signal;
   discharge control means connected to said transition detection means, which receives the voltage of said selected first word line for outputting a discharge control signal in response to the transition detection signal, said discharge control means including a counter responsive to said transition detection circuit and having first and second D type flip flops both connected to operate in response to the transition detection signal, ; and
   switching means which continues to discharge a selected one of said second word lines in response to the discharge control signal, said switching means including at least one series circuit of a switching device and resistance means connected between at least one of said second word lines and a reference potential, said at least one series circuit comprising a first series connection of a first transistor and a first resistor, and a second series connection of a second transistor and a second resistor,
   said first flip flop having an input connected to said selected first word line and an output connected to the input of said second flip flop and to the base of said first transistor;
   said second flip flop having an output connected to the base of said second transistor.

9. A semiconductor memory device comprising memory cells connected to a plurality of first and second word lines, comprising:
   a plurality of bit lines,
   each of said bit lines connected to associated ones of said memory cells,
   address input means for receiving a row address signal required for designating one of said memory cells,
   row decoder means for selecting one of said plurality of first word lines in response to the row address signal from said address input means,
   transition detection means connected so as to receive row address signals from said address input means, which outputs a transition detection pulse of a predetermined width in response to a transition in the row address signal from said address input means,
   a plurality of first control means,
   each of said first control means having a first input node connected to a first word line in a corresponding row, a second input connected to the output of said transition detection means, and an output node,
   each of said first control means receiving the potential of a corresponding first word line during a period of said predetermined pulse width in response to the transition detection pulse from said transition detection means,
   each of said first control means outputting at its output node a potential of a first level when the corresponding first word line is selected by said row decoder means, and a potential of a second level when the corresponding first word line is not selected by said row decoder means, until the next transition detection pulse is received,
   a plurality of second control means,
   each of said second control means having a first input node connected to the output node of a first control means in a corresponding row, a second input node connected to the output of said transition detection means, and an output node,
   each of said second control means outputting at its output node a potential of a first level in response to the first level from a corresponding first control means, and a potential of a second level in response to the second level from said corresponding first control means during a period of the predetermined pulse width, when a transition detection pulse is received from the transition detection means,
   a plurality of discharge means,
   each of said discharge means connected to a second word line in a corresponding row, the output node of said first control means in the corresponding row and the output node of said second control means in the corresponding row, wherein each of said discharge means discharges a corresponding second word line when a potential of a first level is received from the corresponding first control means or a potential of a first level is received from the corresponding second control means.

* * * * *